United States Patent [19]

Lampl

[11] Patent Number: 5,775,509
[45] Date of Patent: Jul. 7, 1998

[54] CARRIER SYSTEM FOR ELECTRICAL COMPONENTS

[75] Inventor: Ewald Lampl, Vienna, Austria

[73] Assignee: Siemens Matsushita Components GmbH & Co. KG, Munich, Germany

[21] Appl. No.: 669,628

[22] Filed: Jun. 24, 1996

[30] Foreign Application Priority Data

Jun. 22, 1995 [DE] Germany ............ 295 10 169 U

[51] Int. Cl.⁶ .................................................. B65D 73/02
[52] U.S. Cl. ........................ 206/714; 206/722; 206/486
[58] Field of Search ........................ 206/341, 343, 206/486, 487, 702, 713, 716, 714, 722

[56] References Cited

U.S. PATENT DOCUMENTS

| 4,049,118 | 9/1977 | Honda et al. | 206/716 |
| 4,411,361 | 10/1983 | Mentzer | 206/716 |
| 4,453,633 | 6/1984 | Hamuro et al. | 206/716 |
| 4,600,116 | 7/1986 | Inano et al. | 206/713 |
| 5,409,111 | 4/1995 | Takumi | 206/344 |
| 5,472,085 | 12/1995 | Gelzer | 206/714 |

OTHER PUBLICATIONS

Book entitled "Thermistoren" [Thermistors], 1993 edition, p. 309. (Siemens Matsushita).

*Primary Examiner*—Paul T. Sewell
*Assistant Examiner*—Nhan T. Lam
*Attorney, Agent, or Firm*—Herbert L. Lerner; Laurence A. Greenberg

[57] ABSTRACT

A carrier system for electrical components, in particular dipole wired electrical components, includes a carrier strip for receiving supply line wires of components and fasteners for fixing the supply line wires to the carrier strip. The fasteners are fastening elements disposed on the carrier strip having guide grooves formed therein for retaining the supply line wires threaded into the guide grooves by force-locking.

6 Claims, 2 Drawing Sheets

CARRIER SYSTEM FOR ELECTRICAL COMPONENTS

BACKGROUND OF THE INVENTION

FIELD OF THE INVENTION

The present invention relates to a carrier system for electrical components, in particular dipole electrical components such as varistors and thermistors, having a carrier strip on which components can be fixed at their supply line wires by fasteners. A carrier system for wired components is known from the book entitled "Thermistoren" ["Thermistors"], 1993 edition, page 309, published by the assignee of the instant application. In that carrier system, components are fixed by their connecting wires to a carrier strip, such as a cardboard carrier strip, through the use of adhesive tape, during production and/or during transport between the component manufacturer and the customer. That is a form-locking kind of fixation, in which it is difficult to adhere to the matrix spacing, or in other words the spacing between the connecting wires. A form-locking connection is one which connects two elements together due to the shape of the elements themselves, as opposed to a force-locking connection, which locks the elements together by force external to the elements.

SUMMARY OF THE INVENTION

It is accordingly an object of the invention to provide a carrier system with a carrier strip for electrical components, which overcomes the hereinafore-mentioned disadvantages of the heretofore-known devices of this general type and with which it is possible to adhere exactly to a matrix spacing.

With the foregoing and other objects in view there is provided, in accordance with the invention, a carrier system for electrical components, in particular dipole wired electrical components, comprising a carrier strip for receiving supply line wires of components; and fasteners for fixing the supply line wires to the carrier strip, the fasteners being fastening elements disposed on the carrier strip, the fastening elements having guide grooves formed therein for retaining the supply line wires threaded into the guide grooves by force-locking. In accordance with another feature of the invention, the fastening elements elastically clamp the supply line wires threaded into the guide grooves.

In accordance with a further feature of the invention, the guide grooves have a given length and an open side facing away from the carrier strip defining a groove wall of the fastening elements, and the fastening elements have attachments on the groove wall for constricting the guide grooves over a portion of the given length to elastically deform the supply line wires threaded into the guide grooves.

In accordance with an added feature of the invention, the guide grooves have a longitudinal direction and a shape crosswise to the longitudinal direction elastically deforming the supply line wires threaded into the guide grooves.

In accordance with an additional feature of the invention, the fastening elements have bulges facing toward one another at the guide grooves.

In accordance with yet another feature of the invention, there are provided attachments on the fastening elements reaching across the guide grooves.

In accordance with a concomitant feature of the invention, the carrier strip is rigid or flexible.

Other features which are considered as characteristic for the invention are set forth in the appended claims.

Although the invention is illustrated and described herein as embodied in a carrier system for electrical components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
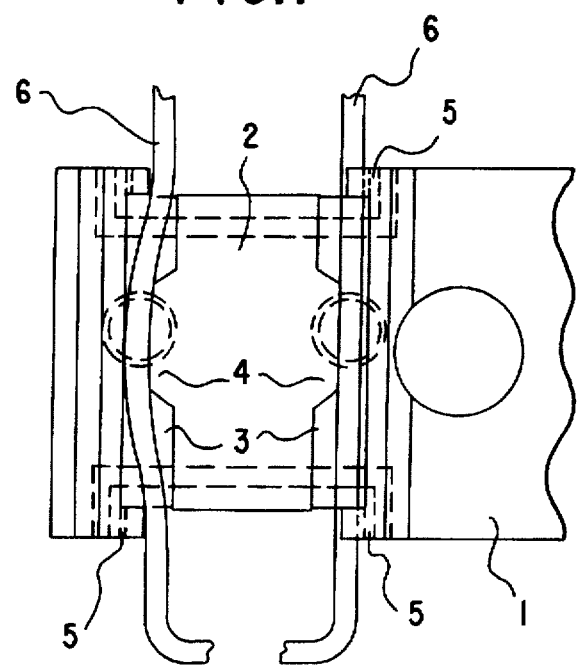
FIG. 1 is a fragmentary, diagrammatic, top-plan view of a first embodiment of a carrier system according to the invention.

DESCRIPTION OF THE PREFERRED EMBODIMENTS:

Referring now to the figures of the drawings in detail and first, particularly, to FIG. 1 thereof, there is seen an embodiment of a carrier system according to the invention in which a fastener 2 is provided on a carrier strip 1. The fastener 2 is formed by a fastening element being disposed on the carrier system 1 and having guide grooves 3 formed therein. The guide grooves 3 are constructed in such a way that supply line wires 6 being threaded into them are force-lockingly held. The supply line wires 6 are part of non-illustrated wired electrical components. The guide grooves 3 are open on their side remote from the carrier strip 1 and have attachments 4 on a groove wall that constrict the guide grooves 3 over a portion of their length so as to elastically deform the supply line wires 6 threaded into them.

During an assembly operation, the supply line wires 6 are elastically deformed by suitable tools, such as an assembly shoe, and clamped into the guide grooves 3. In the process, the supply line wires 6 are elastically clamped in such a way that they can transmit forces longitudinally by friction.

Attachments 5 provided on the fastener 2 additionally retain the supply line wires 6 by reaching over the guide grooves 3.

Figure 2:
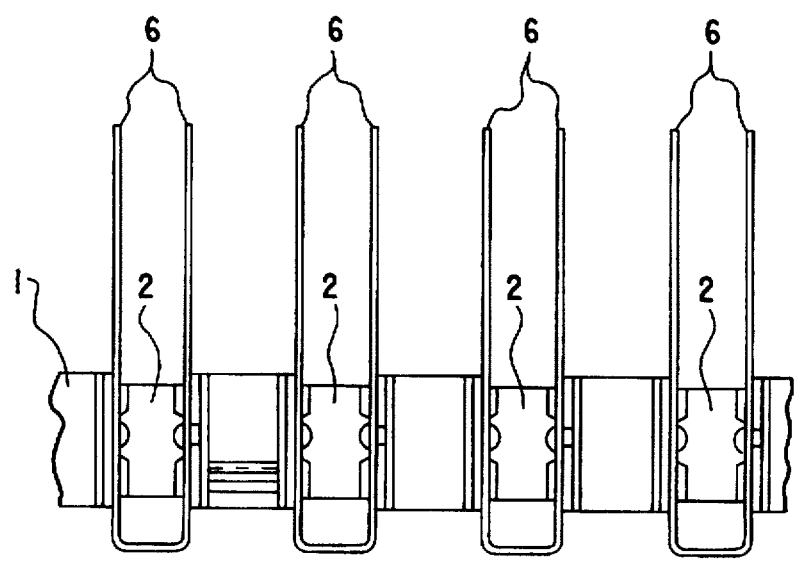
FIG. 2 is a reduced, fragmentary, top-plan view of a carrier strip with fasteners for the carrier system of FIG. 1 provided thereon.

FIG. 2 shows a portion of a carrier strip 1 with fasteners 2 provided thereon in accordance with FIG. 1, and with supply line wires 6 threaded into the fasteners.

Figure 3:
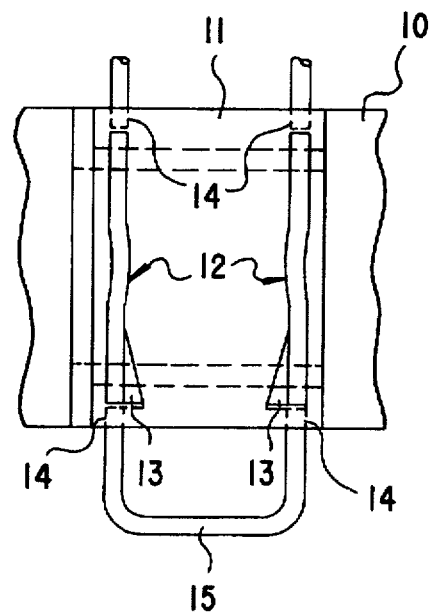
FIG. 3 is a view similar to FIG. 1 of a second embodiment of the carrier system of the invention.
Figure 4:
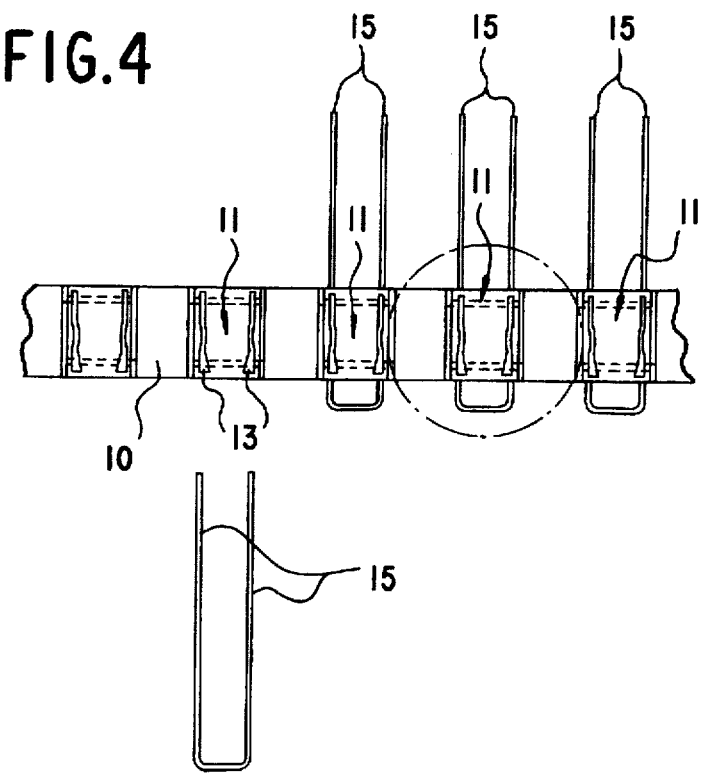
FIG. 4 is a view similar to FIG. 2 of a carrier strip with fasteners for the carrier system of FIG. 3 provided thereon.

In an embodiment according to the invention which is shown in FIGS. 3 and 4, a fastener 11 is provided in which guide grooves 13 are formed crosswise to its longitudinal direction through the use of inward-pointing bulges 12, in such a way that supply line wires 15 threaded into them are elastically deformed. The wires are thrust into the guide grooves 13 in such a way that they remain elastically prestressed and are capable of transmitting forces longitudinally.

In the carrier system of FIGS. 3 and 4 as well, attachments 14 that reach across the guide grooves 13 are provided as in FIG. 3 and additionally retain the supply line wires 15.

The carrier strip 1 of FIGS. 1 and 2 and a carrier strip 10 of FIGS. 3 and 4 may be constructed rigidly or flexibly.

The carrier system of the invention has the advantage of fixing a matrix spacing in an exactly form-locking manner through the use of the guide grooves 3 of FIGS. 1 and 2 or 13 of FIGS. 3 and 4. Moreover, the possibility exists of displacing the supply line wires 6 and 15 longitudinally and of adapting them to the various machining steps involved in the production of the components. The carrier strips with the fasteners located on them may be re-used once the supply line wires have been pulled out.

I claim:

1. A carrier system for electrical components, comprising:

a carrier strip for receiving supply line wires of components;

fasteners for fixing the supply line wires to said carrier strip, said fasteners being fastening elements disposed on said carrier strip, said fastening elements having guide grooves formed therein for retaining the supply line wires threaded into said guide grooves; and said guide grooves having an open side facing away from said carrier strip, said guide grooves defining a groove wall of said fastening elements, and said fastening elements having attachments on said groove wall for elastically deforming and clamping the supply line wires threaded into said guide grooves.

2. The carrier system according to claim 1, wherein said guide grooves have a given length and said attachments on said groove wall constrict said guide grooves over a portion of said given length to elastically deform the supply line wires threaded into said guide grooves.

3. The carrier system according to claim 1, including additional attachments on said fastening elements reaching across said guide grooves.

4. The carrier system according to claim 1, wherein said carrier strip is a rigid carrier strip.

5. The carrier system according to claim 1, wherein said carrier strip is a flexible carrier strip.

6. The carrier system according to claim 1, wherein the supply line wires are two wires for dipole wired electrical components.

* * * * *